United States Patent [19]

Schwee et al.

[11] 4,199,819

[45] Apr. 22, 1980

[54] FIELD DETERMINED CROSS-TIE MEMORY PROPAGATION CIRCUIT

[75] Inventors: Leonard J. Schwee, Colesville; Wallace E. Anderson, Beltsville; Yuan-Jye Liu, Rockville; Ronald N. Lee, Silver Spring, all of Md.

[73] Assignee: The United States of America as represented by the Secretary of the Navy, Washington, D.C.

[21] Appl. No.: 958,751

[22] Filed: Nov. 8, 1978

[51] Int. Cl.$^2$ ............................................ G11C 19/08
[52] U.S. Cl. ..................................... 365/87; 365/172
[58] Field of Search .................. 365/87, 88, 171, 172, 365/173

[56] References Cited

U.S. PATENT DOCUMENTS 4,128,894  12/1978  Chen ....................................... 365/14

OTHER PUBLICATIONS

AIP Conference on Magnetism & Magnetic Materials, Dec. 9-12, 1975, Philadelphia, Pa., pp. 624-629.

*Primary Examiner*—James W. Moffitt
*Attorney, Agent, or Firm*—R. S. Sciascia; A. L. Branning; R. E. Bushnell

[57] ABSTRACT

A symmetric narrow-wide electrical conductor for propagating binary information represented by Bloch line - crosstie pairs along a serriform crosstie thin magnetic film strip. Another conductor is made with alternate segments disposed upon opposite surfaces of the crosstie strip.

2 Claims, 9 Drawing Figures

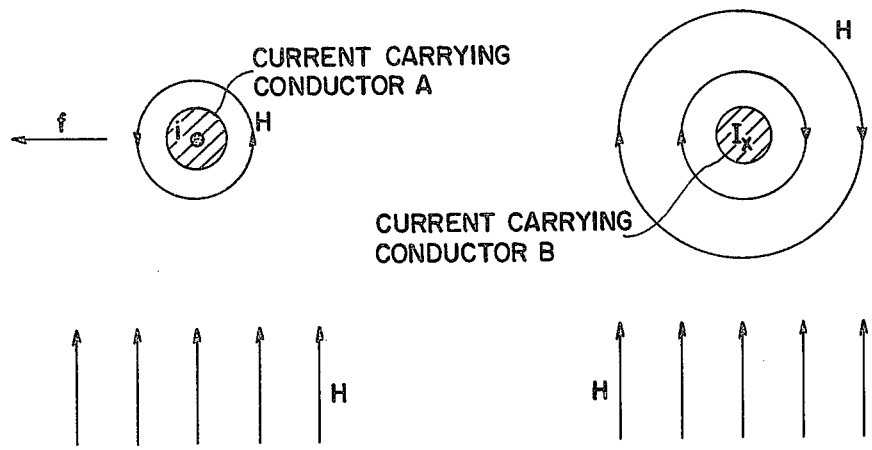
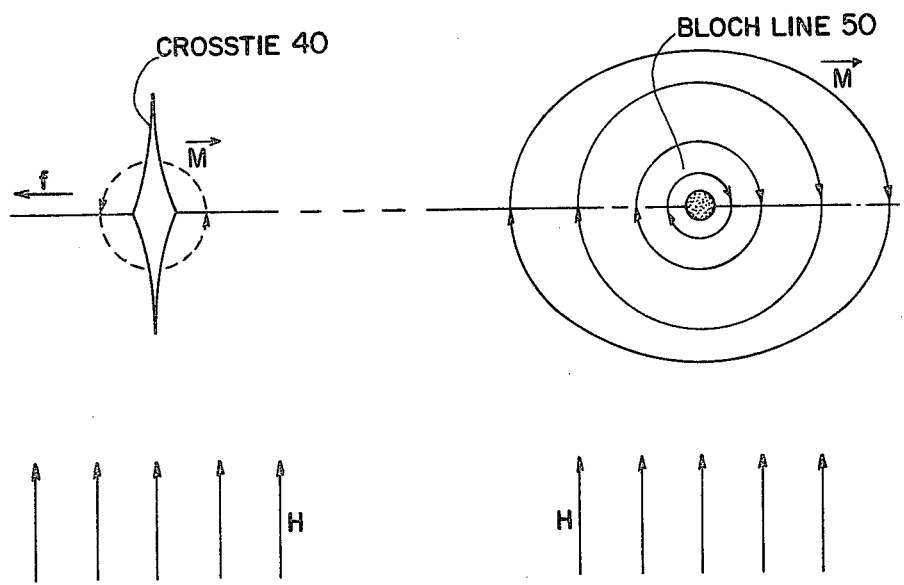
FIG. 1

$$H_s = A \sin \frac{2\pi x}{l} \text{ Oe}$$

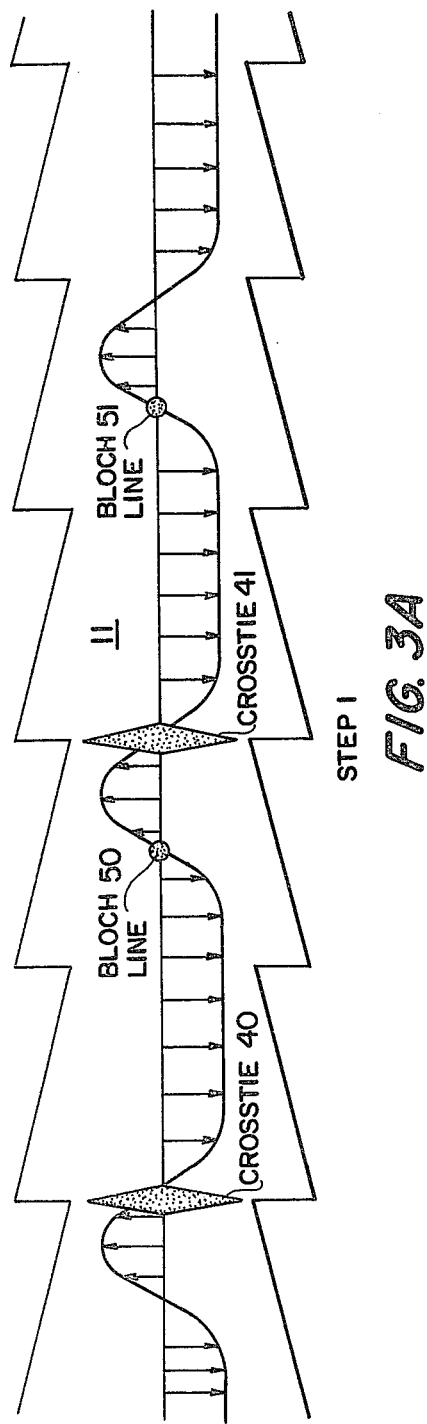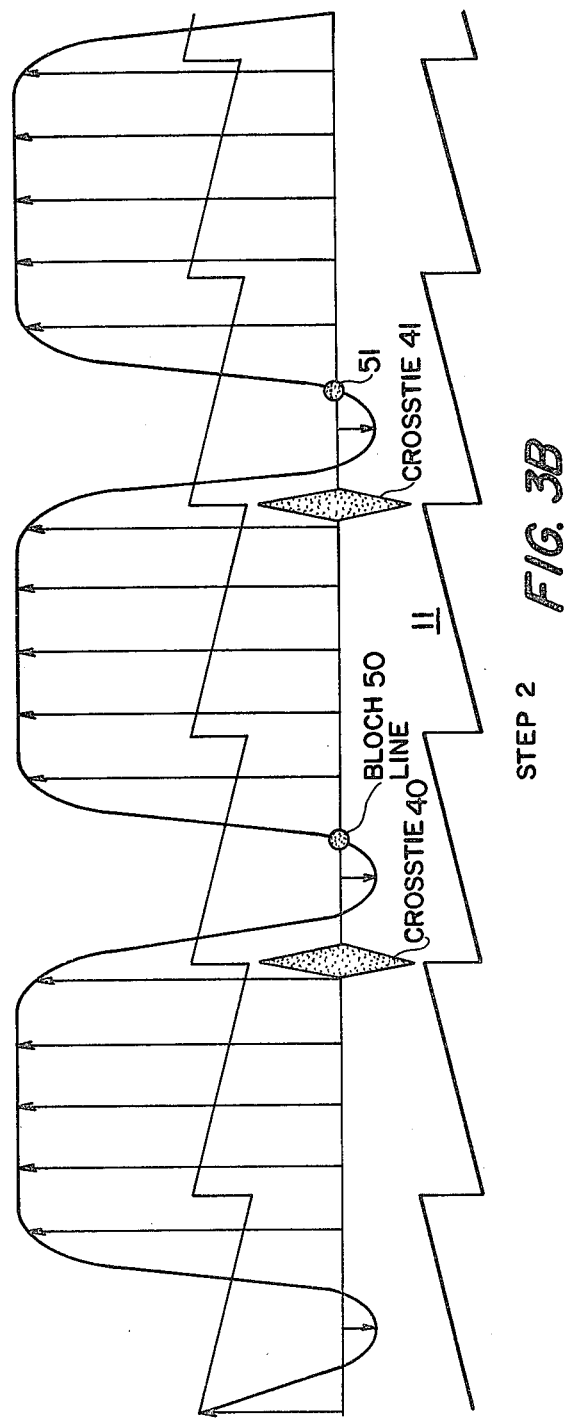

FIELD DETERMINED CROSS-TIE MEMORY PROPAGATION CIRCUIT

BACKGROUND OF THE INVENTION

The present invention relates to the art of shift registers and more particularly, to serial access, thin magnetic film memories using domain walls for the storage and propagation of binary information. Prior thin-film shift register art discloses serial access memories with storage and propagation of reversal domains, e.g., U.S. Pat. No. 3,846,770, and inversion of Neel walls with storage and propagation of Block lines, crossties, and inverted Neel walls along a domain wall, e.g., U.S. Pat. No. 3,868,659.

In the crosstie memory, the combination of a Bloch line, negative Neel wall and a crosstie are considered to be a logical "one," while the absence of this Bloch line-crosstie pair is considered to be a logical "zero." With a single conductor placed above and parallel to serrated strips of permalloy about 370 Å thick and twenty-five microns wide, it is possible to effect propagation. A small amplitude (e.g., about 3.0 Oerstads) negative pulse about twenty nanoseconds long is used to move the Bloch line to the next potential well. Then a ten nanosecond positive pulse of about fifteen Oerstads is applied to relocate the crosstie. During application of the large positive pulse a new crosstie Bloch line pair is formed within the original Bloch line crosstie pair and the trailng Bloch line crosstie pair is annihilated. Thus, the original Bloch line and a new crosstie end up one serration farther along the strip. This technique worked for pulses with amplitude and time duration tolerances of only a few percent. Attempts to increase the tolerances of operation have been unsuccessful. A more detailed description of the nucleation and propagation of Bloch line-crosstie pairs appears in U.S. Pat. No. 4,100,609.

SUMMARY OF THE INVENTION

A circuit is disclosed for effecting propagation of binary bits of information represented by Bloch line-crosstie pairs along a serriform crosstie thin magnetic film strip. As used, every two serration lengths of the crosstie film strip serves as a discrete address. The propagation circuit is an oblong electrical conductor symmetrically deposited between opposite serriform margins of the crosstie strip. Alternate serration lengths of the propagation conductor are wider than adjoining intermediate serrration lengths, thereby allowing the propagation current to create spatially varying magnetic fields in the crosstie strip. A magnetic field of an external coil is superimposed upon the field created by the propagation conductor in order to increase the amplitude of the crosstie stepping pulses. Alternately, a propagation conduction segmented with alternate sections of equal width deposited upon opposite surfaces of the crosstie strip can also provide field determined propagation of Bloch line-crosstie pairs.

According, it is an object of the present invention to provide an electrical conductor for reliably propagating Bloch line crosstie pairs along a thin magnetic film strip.

It is another object to provide an electrical conductor for reliably propagating Bloch line-crosstie pairs along a thin magnetic film strip, that has a greater tolerance to variations in pulse amplitude and duration.

BRIEF DESCRIPTION OF THE DRAWINGS

A more complete appreciation of this invention, and many of the attendant advantages thereof, will be readily enjoyed as the same becomes better understood by reference to the following detailed description when considered in conjunction with the accompanying drawings in which like members indicate the same or similar components, wherein:

FIG. 1 is a top view of an idealize representation of the magnetic fields surrounding a pair of current carrying conductors, a crosstie, and a Bloch line.

FIG. 3A illustrates the amplitude of the magnetic field required to step a Bloch line as a function of the dimensions of a serriform thin magnetic film strip.

FIG. 3B illustrates the amplitude of the magnetic field required to step a crosstie as a function of the dimensions of a serriform thin magnetic film strip.

DETAILED DESCRIPTION OF THE INVENTION

To explain field determined propagation, it is helpful to resort to analogy. The Bloch line and the crosstie behave in a magnetic field much as current carrying conductors A and B in FIG. 1. Just as a current in a wire B produces a circular magnetic field about it interacts with uniform magnetic field H to give rise to the Lorentz force, so also the circulation of the magnetization about a Bloch line 50 gives rise to a force in a uniform magnetic field H. The Bloch line and the current carrying conductor can then be considered as circulation in a uniform potential flow with resulting forces. Although this analogy limps in terms of magnetization directions about a crosstie, it is useful to consider the crosstie as a current carrying conductor with a smaller current directed opposite to that of the Bloch line. Also, a crosstie exhibits more friction than the Bloch line, requiring a 3.0 Oe coercive force as compared to a 0.1 Oe coercive force for the Bloch line.

In *The Crosstie Memory*, published in IEEE Transactions on Magnetism, MAG-12, pages 608 through 613, in 1976, L. J. Schwee, H. R. Irons and W. E. Anderson described the serriform crosstie memory strip as having potential wells for the crossties and potential wells for the Bloch lines so that crossties tend to come to rest in stable positions at necks of the strip while Bloch lines rest in stable positions in between the crossties. The stable positions can just as well be described in terms of a force field or equivalent magnetic field, the latter being shown in FIG. 2. The equivalent magnetic field is a function of the geometry of the memory strip and can be approximately expressed in Oerstads as:

$$H_s = A\ SIN\ (2\pi x/l) \qquad (1)$$

Figure 2:
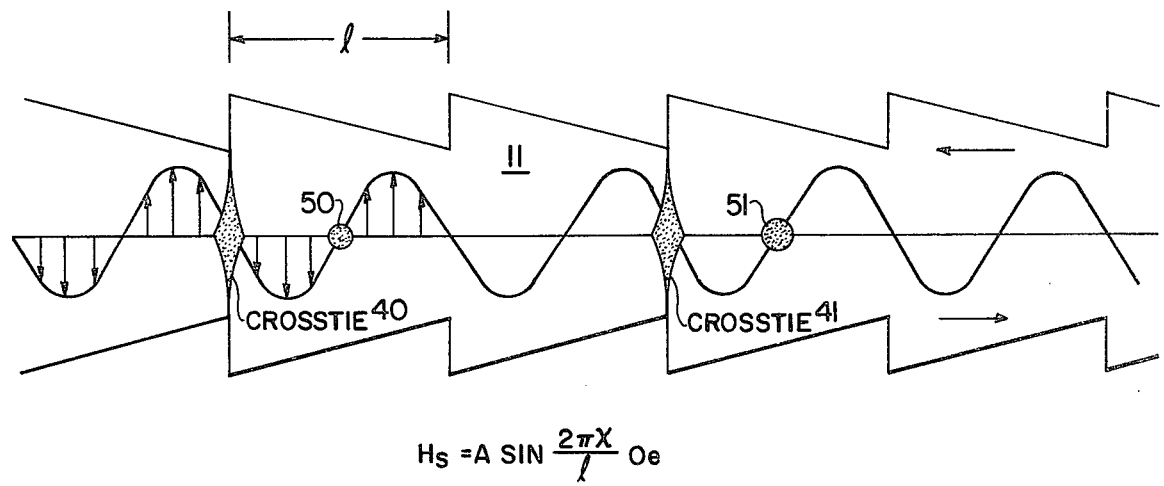
FIG. 2 is an idealized representation of the equivalent magnetic field of a serriform thin magnetic film strip.

Notice that in FIG. 2 if the Bloch is moved forward a bit, the magnetic field forces it back into position. This indicates that the positions of Bloch lines 50, 51 shown are stable positions. If the Bloch lines are interchanged with the crossties 40, 41, the Bloch lines would be in unstable positions. The value of the coefficient A of equation (1) can be easily measured by applying an uniform field (down in FIG. 2) with magnitude gradually increased until a Bloch line jumps from an unstable position to the next stable position. The valve of coefficient A equals the magnitude of the applied field at the instant that the Bloch line jumped.

Figure 4:
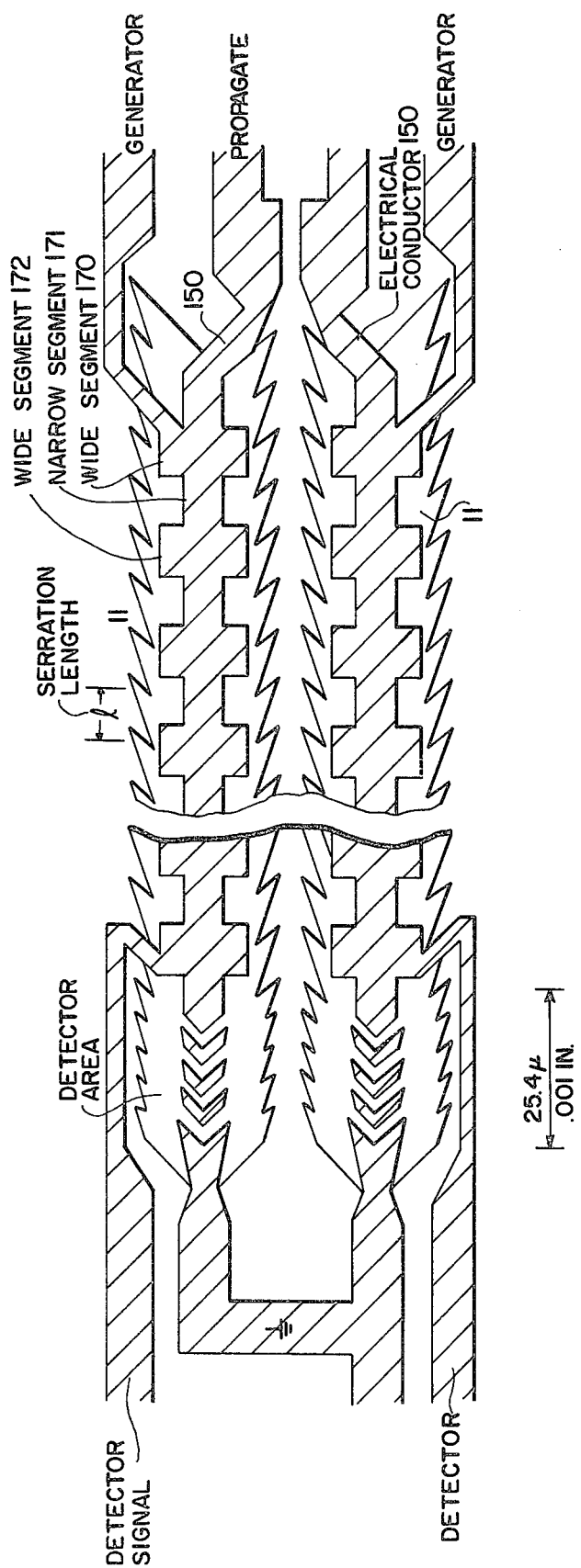
FIG. 4 is a top view of two serriform thin magnetic film strips overlaid with narrow-wide gold propagation conductors.

In order to move the bit to the next serrating, two steps are required. First the Bloch line is moved and then the crosstie. The ideal field configurating for stepping the Bloch line is shown in FIG. 3A. Next fields must be applied to move the crosstie. The fields used for crosstie movement must be larger because of the greater coervice force of the crosstie. The ideal fields for this operation are shown in FIG. 3B. The positions of the Bloch line and crosstie shown in FIGS. 3A and 3B are stable positions to which they have moved as a result of the applied fields. To experimentally confirm the validity of such an approach gold was plated to a thickness of about 3000 Å through a photomask and then the substrate was remasked and the permalloy was etched as shown in FIG. 4. The distance between serrations was 8 micron and the width of the strip at the necks was 15 microns. The narrow part of the plated gold conductor was 6 microns wide and the wide part of the conductor was 12 microns wide. A 1 mA current through the narrow-wide conductor corresponds to about 1 Oe applied field in the narrow section and 0.5 Oe in the wide section. The gold is thin enough so that the crosstie and Bloch line can be seen through the gold using a Bitter solution. In addition to the currents through the narrow-wide conductor a coil was used so that by superimpsosing the uniform coil field and the spatially varying field the idealized field shown in FIGS. 3A and 3B could be simulated. Propagation resulted as expected. A 20 mA current was needed in the narrow-side conductor to provide sufficient field for crosstie movement. The field difference resulting from the 20 mA current was about 10 Oe at adjacent serrations. The narrow-wide field can be approximated by a sinusoidal field given by the equation $$H_g = B + B/3 \sin \pi x/l \text{ where} \qquad (2)$$

in the experiment described B was equal to ±15 Oe for crosstie movement and ±4.5 Oe for Bloch line movement. The field due to the coil was constant with respect to distance along the serrated strip and can be described by the equation $$H_c = C. \qquad (3)$$

Figure 5:
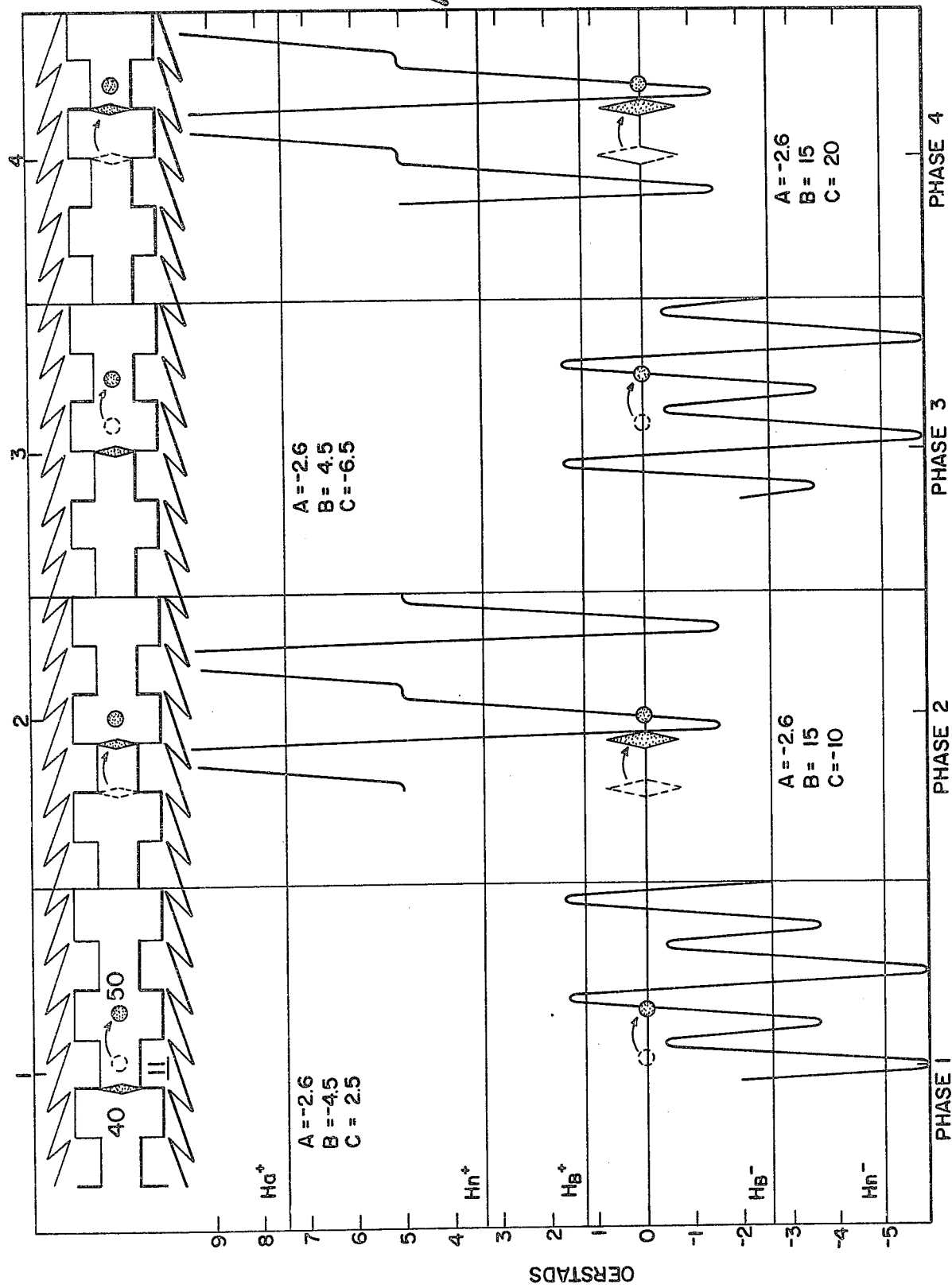
FIG. 5 is a two coordinate graph plotting, in four phases, the resultant magnetic fields due to the serriform thin magnetic film strip and the applied magnetic fields.

The four phases used to propage one shift register period (i.e., two serration lengths form one period) are shown in FIG. 6 for a crosstie memory strip having the dimensions shown in FIG. 5. The curves in FIG. 6 plot the net magnetic field, $H_t$, seen by the Bloch line and crosstie as a function of distance along the crosstie strip, where $$H_t = H_s + H_g + H_c \qquad (4)$$

In each of the four phases the values of B and C change but the value of A remains the same and it is taken to equal the $H_B-$ which is the negative uniform field required to move the Bloch line along the serrated strip. It is thus a measure of the depth of the potential well in which the Bloch line is stable. The value of $H_n-$ in FIG. 5 is the measured negative nucleation field using a uniform field. The applied fields $H_g + H_c$ should not exceed $H_n-$ or crossties and Blcoh linescan be generated where "zeros" are supposed to be. $H_B-$ is the positive uniform field required to move a bloch line from its potential well and $H_{B+}$ is the field needed to general a new crosstie-Bloch line pair. $H_a+$ is the uniform field required to annihilate Bloch lines and crossties in the serrated strip.

The fields of phases 1 and 3 are identical except that they are displaced by one serration length. The same is true of phases 2 and 4. In phase 1 the Bloch line moves to its stable position as shown and cannot move beyond the point. In phase 2 the Bloch line is trapped again and cannot move back toward the crosstie because of the local negative field between them. Thus the crosstie is forced to move.

The narrow-wide gold strip used in the above experiment demonstrated that validity of the field propagation technique. However, it is not the only method that can be used. For example, the wide part of the narrow-wide conductor can be eliminate completely so that the current must go through the permalloy. Less current is then needed through the strip but the resistance of the strip increases considerably and for strips about 256 bits long the voltages are high enough to dissociate the water in the Bitter solution and corrode the permally. However a hydrocarbon based Bitter solution can be used in this case. This experiment was tried but too much power was required to move the crossties and the 10 microns wide strips overheated. The method may be workable for wide serrated strips with shallow potential wells.

Figure 6A:
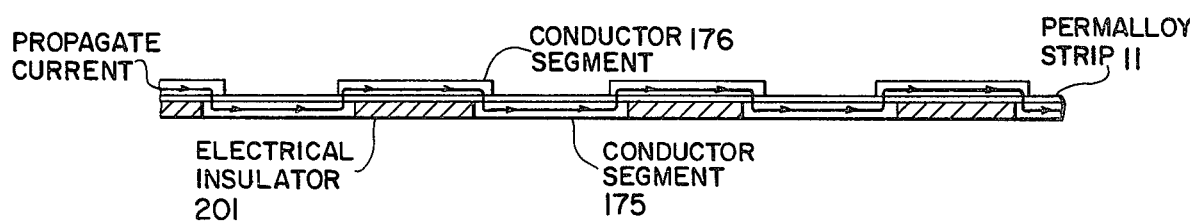
FIGS. 6A, 6B and 6B illustrate side views of three alternative progagation conductors for obtaining field determined propagation of Bloch line-crosstie pairs along a thin magnetic film strip.
Figure 6B:
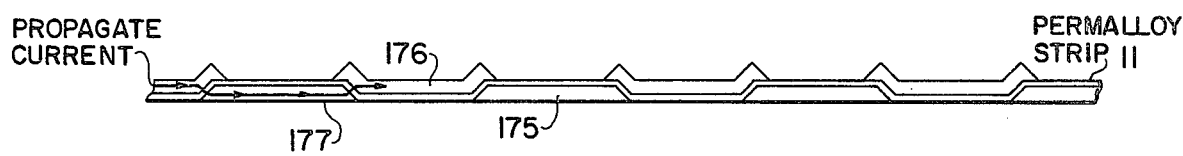
Figure 6C:
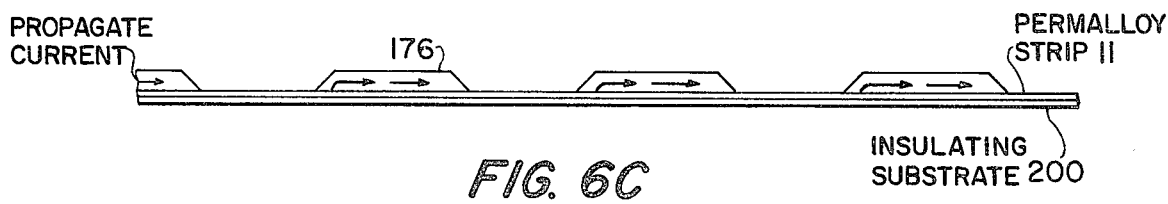

The most efficient method of applying the required fields would result if the current could be forced to go above the strip on one serration, under the strip on the next and so on as shown in FIG. 6A. Here the hatched areas represent an oxidized or insulating region in the film below the permalloy strip 11. An alternative structure is shown in FIG. 6B. The thickness of the films is greatly exaggerated in order to adequately illustrate the concept. Still another structure for obtaining the over and under propagation current flow is shown in FIG. 6C. Here a metal film about 400 Å thick underlies the permalloy with an other metal film about 4000 Å thick above the permalloy on every other serration. If the metal films are about 10 times more conductive than the permalloy most of the current will pass below or above the permalloy as desired. The techniques described in FIG. 6 will allow the use of currents of about 5 mA instead of the 20 mA used in the narrow-wide conductor case, also the power in the coil or stripline will be less to achieve the same propagation fields as shown in FIGS. 6A, 6B and 6C.

Although described in conjunction with a straight, serriform crosstie memory strip, if the thin strip is magnetically isotropic, the crosstie memory strip supporting the propagation conductor may be curved, serpentine, circular or spiral. Other details about the field determined propagation conductor and ancillary Bloch line detection circuitry are disclosed in either a paper entitled "Approached Toward Field Determined Propagation of Crossties and Bloch Lines," written by L. J. Schwee, W. E. Anderson, Y. J. Liu and R. N. Lee, and printed in the Conference Proceedings, Journal of Applied Physics, volume 49, number 3, part II, in March, 1978, or in our copending application, Ser. No. 958,913, filed Nov. 8, 1978 and entitled "Crosstie Memory Bit Stretcher Detector," both references being incorporated into this application.

What is claimed as new and desired to be secured by a Letters Patent is the United States is:

1. A serially accessible crosstie memory comprising:
a thin-film strip of magnetic material of uniform thickness exhibiting a continuous, stationary domain wall spaced between opposite oblong serriform margins;
each of the serriform margins formed by adjacent unidirectionally oriented denticles of equal serration length;
an electrical conductor of a substance characterized by a lower resistivity than the magnetic material, deposited on one surface of the thin-film strip and spaced between opposite serriform margins;
the electrical conductor having alternate serration lengths of greater width than adjoining intermediate serration lengths.

2. A serially accessible crosstie memory, comprising:
a thin-film strip of magnetic material of uniform thickness having unidirectionally oriented denticulation along opposed oblong margins parallel to and symmetric about an oblong centerline;
an electrical conductor of a substance characterized by a lower resistivity than the magnetic material, deposited in discrete alternate segments of equal length on opposite surfaces of the thin-film strip, alternate segments overlaid upon overlapping volumes of the thin-film strip, the segments being spaced apart and symmetrically disposed along the oblong centerline.

* * * * *